United States Patent [19]
Valster

[11] Patent Number: 5,468,975
[45] Date of Patent: * Nov. 21, 1995

[54] OPTOELECTRONIC SEMICONDUCTOR DEVICE

[75] Inventor: Adriaan Valster, Eindhoven, Netherlands

[73] Assignee: U.S. Philips Corporation, New York, N.Y.

[*] Notice: The portion of the term of this patent subsequent to Jan. 10, 2012, has been disclaimed.

[21] Appl. No.: 352,283

[22] Filed: Dec. 8, 1994

Related U.S. Application Data

[63] Continuation of Ser. No. 62,679, May 17, 1993, abandoned.

[30] Foreign Application Priority Data

May 18, 1992 [EP] European Pat. Off. ............ 92201399

[51] Int. Cl.[6] .................................................. H01L 33/00
[52] U.S. Cl. .................. 257/97; 257/13; 257/96
[58] Field of Search ................... 257/13, 85, 12, 257/86, 95, 96, 97

[56] References Cited

U.S. PATENT DOCUMENTS 4,788,688 11/1988 Hasenberg et al. ............... 257/13
5,381,024 1/1995 Valster ............................... 257/97

FOREIGN PATENT DOCUMENTS 0384756 8/1990 European Pat. Off. .
0390262 10/1990 European Pat. Off. .
0444366 9/1991 European Pat. Off. .
0458408 11/1991 European Pat. Off. .
0517626 12/1992 European Pat. Off. .
4162482 1/1990 Japan .
4106991 3/1990 Japan .

*Primary Examiner*—Jerome Jackson
*Assistant Examiner*—Nathan Kip Kelley
*Attorney, Agent, or Firm*—Steven R. Biren

[57] ABSTRACT

An optoelectronic semiconductor device includes a first cladding layer (1) of the first conductivity type provided on a substrate (11), an active layer (2), a second cladding layer (3) of a second conductivity type, an intermediate layer (4), and a third cladding layer (5) also of the second conductivity type, the thickness of the second cladding layer (3) being such that the intermediate layer (4) lies within the optical field profile of the active layer (2), while the intermediate layer (4) includes a semiconductor material with a lower bandgap than the second (3) and third (5) cladding layers. Such devices, often in the form of diode lasers, are used inter alia in optical glass fibre communication and optical disc systems. A disadvantage of such devices is that their starting currents are comparatively high.

The semiconductor material of the intermediate layer (4) has a lattice constant which is different from that of the substrate (11) and a bandgap which is greater than the energy of the radiation emitted by the active layer (2). As a result, the simplest possible semiconductor materials may be chosen for the intermediate layer (4), which materials have a low absorption for the emitted radiation. The starting current is reduced by this and a comparatively thick intermediate layer (4) can be used, which favors its use as an etching stopper layer. These advantages are particularly realised in devices comprising a mesa (20), such as ridge-type lasers. Ternary semiconductor materials such as InGaAs and InGaP in that case form very suitable materials for the intermediate layer (4).

9 Claims, 1 Drawing Sheet

OPTOELECTRONIC SEMICONDUCTOR DEVICE

This is a continuation of application Ser. No. 08/062,679, filed May 17, 1993, now abandoned.

BACKGROUND OF THE INVENTION

The invention relates to an optoelectronic semiconductor device comprising a semiconductor body with a semiconductor substrate of a first conductivity type on which are at least present in that order a first cladding layer of the first conductivity type, an active layer, a second cladding layer of a second conductivity type, an intermediate layer, and a third cladding layer also of the second conductivity type, the thickness of the second cladding layer being such that the intermediate layer is within the optical field profile of the active layer, while the intermediate layer comprises a semiconductor material having a lower bandgap than the second and third cladding layers.

Such optoelectronic semiconductor devices are used inter alia as radiation guides, LEDs or diode lasers. In the case of diode lasers, they are mainly used as radiation sources for inter alia information-processing systems such as laser printers, with which information is written, optical disc systems such as Compact Disc (Video) (CD(V)) players or bar code readers, with which information is read, and Digital Optical Recording (DOR) systems, with which information is written and read. In addition, diode lasers are used as transmitters in systems for glass fibre communication.

Such a device in the form of a semiconductor diode laser is known from European Patent Application no. 90314466.5 which was published 4 Sep. 1991 under no. 0 444 366. This document describes a diode laser having a mesa or a groove structure in which on an n-Gas substrate an active InGaP layer, is present between two cladding layers of n- and p-InAlGaP, respectively, over which an intermediate layer, here a thin InGaP layer, is present on which a third cladding layer of p-InAlGaP is arranged. The intermediate layer which serves as an etching stopper layer lies within the amplification profile of the active layer.

A disadvantage of the known optoelectronic semiconductor device is that in practice no suitable thickness for the etching stopper layer is found: with a thinner intermediate layer (for example, 3 nm thickness) etching sometimes continues through this layer. This is true especially when the layer(s) to be selectively etched above the intermediate layer varies/vary in thickness over a slice, so that a somewhat longer etching time is required for ensuring complete removal of the said layer(s) everywhere on the slice. The intermediate layer is then exposed to the etchant for too long a period in those locations where the layer(s) to be selectively etched is/are thinnest. If the intermediate layer is somewhat thicker, for example approximately 10 nm, it is true that the intermediate layer functions well as an etching stopper layer, but it is found that the starting current of the diode laser is increased, which is undesirable.

SUMMARY OF THE INVENTION

The present invention has for its object inter alia to provide an optoelectronic semiconductor device—more particularly a semiconductor diode laser— which does not exhibit the said disadvantage, or at least to a much lesser degree, and which accordingly comprises an intermediate layer which forms a good etching stopper layer and whose starting current is low.

According to the invention, an optoelectronic semiconductor device of the kind mentioned in the opening paragraph is for this purpose characterized in that the semiconductor material of the intermediate layer has a lattice constant which is different from the lattice constant of the substrate and has a bandgap which is greater than or equal to the energy of the radiation emitted by the active layer. Since the intermediate layer comprises a semiconductor material with a lattice constant different from that of the substrate, the possibilities for choosing a semiconductor material which should be as simple as possible for the intermediate layer are strongly increased. As a result, the intermediate layer may comprise a material which differs comparatively strongly chemically from the material of the third cladding layer, which often comprises a ternary or even quaternary material. The intermediate layer thus forms an effective etching stopper layer. Since the semiconductor material of the intermediate layer has a bandgap which is greater than the energy of the emitted radiation quanta, according to the invention, the absorption in the intermediate layer of the quanta emitted by the active layer decreases. Owing to the decrease in absorption, the starting current is reduced. The intermediate layer may also be comparatively thick thanks to the reduced absorption, so that this layer is (even) more effective as an etching stopper layer. The semiconductor material of the intermediate layer may be a binary III-V semiconductor material. An additional advantage of such materials is that they are easy to manufacture. Examples of devices according to the invention are: a diode laser in the InP/InGaAsP material system (emission wavelength between 1 and 1,5 μm, InP substrate) with an intermediate layer of GaAs, ALAS, or AlSb and a diode laser in the GaAs/InGaP/InGaAlP material system (emission wavelength between 0,5 and 0,7 μm, GaAs substrate), or a diode laser in the GaAs/AlGaAs material system (emission wavelength between 0,7 and 0,9 μm, GaAs substrate) with an intermediate layer of GaP or AlP. In these examples, the deviation of the lattice constant of the intermediate layer from that of the substrate is approximately 3 to 4%, which is acceptable for a thickness of the intermediate layer which is smaller than or equal to approximately 7 nm. When the product of the lattice constant deviation and the thickness of the intermediate layer becomes great, dislocations may arise near the intermediate layer, or its morphology may deteriorate.

The optoelectronic device according to the invention offers an increasing advantage in proportion as—within a given material system—the wavelength of the radiation emitted by the active layer is shorter. In these cases, in fact, the semiconductor material of the intermediate layer will have to have an increasing bandgap in order to limit the absorption. This can only be achieved with an intermediate layer without difference in lattice constant in that the same semiconductor material is used—as already suggested in the InGaP/InAlGaP material system—, in this case InAlGaP, for the intermediate layer and for the cladding layers, or in that an MQW (=Multi Quantum Well) structure is used as an intermediate layer. In either solution, the selectivity of the etchant for the (third) cladding layer relative to the intermediate layer leaves to be desired. The use in the intermediate layer of a binary semiconductor material having the same lattice constant as the substrate, i.e. GaAs in the InGaP/InAlGaP system, has also been suggested. This has the disadvantage that the absorption in such an intermediate layer is very great.

A particularly favorable embodiment of an optoelectronic device according to the invention, in which the intermediate layer comprises a ternary semiconductor material, is characterized in that the composition of the semiconductor material of the intermediate layer is so chosen that the semiconductor material of the intermediate layer has a smaller lattice constant than the substrate. Such an intermediate layer of a ternary semiconductor material, for example, an InGaAs intermediate layer in the InP/InGaAsP or an InGaP intermediate layer in the InGaP/InAlGaP material system, forms a good etching stopper layer for a selective etchant of the semiconductor material of the third cladding layer, so of InP in the former material system and of InAlGaP in the latter material system. In this embodiment, the said deviation of the lattice constant of the intermediate layer results in a greater bandgap, so that the absorption decreases, which reduces the starting current, so that the intermediate layer may be comparatively thick and be more effective as an etching stopper layer. An intermediate layer comprising a ternary material has the additional advantage that the same material may be chosen for this layer as for the active layer, which keeps the manufacture comparatively simple. An additional great advantage of such an intermediate layer is that the deviation of the lattice constant from that of the substrate can be accurately set, so that the bandgap of the intermediate layer material can be accurately set and the resulting voltage in the intermediate layer can be optimized with great accuracy. In this embodiment, good results were found when the value of the deviation of the lattice constant lies between −0,2% and −2%, and the thickness of the intermediate layer lies between 5 and 15 nm, preferably between 6 and 12 nm. The optimum thickness and lattice constant deviation depend inter alia on the wavelength of the emitted radiation.

A preferred embodiment of a device according to the invention, which comprises a semiconductor diode laser with connection conductors, is characterized in that the semiconductor diode laser has a mesa which comprises the third cladding layer, a contact layer of the second conductivity type is present at least at the area of the mesa and in contact with the third cladding layer, and the upper connection conductor extends over the contact layer and the portion of the semiconductor body situated adjacent the mesa. Such "ridge-type" lasers are suitable for many applications. When the contact layer is exclusively at the area of the mesa, the upper connection conductor forms a substantially ohmic contact there with the contact layer, and outside that region forms a junction comprising a Schottky barrier with the semiconductor material situated below the connection conductor, so that any supplied current flows mainly through the mesa. The portion of the intermediate layer situated outside the mesa may serve to form the barrier, but alternatively—if the latter portion of the intermediate layer was removed by (selective) etching—the portion of the second cladding layer situated next to the mesa may perform this function. In a second modified embodiment of such a ridge-type laser, there is an insulating layer on either side of the mesa, the upper connection conductor extending over said insulating layers. In a third modified embodiment of such a ridge-type laser, a further semiconductor layer of the first conductivity type is present on either side of the mesa, and the contact layer extends over the mesa and over the adjacent portions of the further semiconductor layer. The latter modified embodiment is manufactured by means of three separate epitaxy processes. In the InGaP/InAlGaP system, it is then a particular advantage that according to the invention the intermediate layer need not comprise the same semiconductor material, i.e. InAlGaP, as the cladding layers, but, for example, InGaP. Indeed, the intermediate layer is exposed to oxygen between the first and the second epitaxy process, and the oxidation taking place then is not irreversible since the intermediate layer does not comprise aluminium. The result is that a second epitaxy process may be carried out without problems. Especially in the InGaP/InAlGaP material system, the mesa in all modified versions preferably comprises a transition layer which is situated between the third cladding layer and the contact layer and whose bandgap lies approximately halfway between the bandgaps of said layers. Devices according to the invention may be manufactured advantageously not only in the GaAs/AlGaAs material system (substrate of GaAs) but also in the InP-InGaAsP (substrate of InP) and InGaP/InAlGaP (substrate of GaAs) material systems. The latter material systems cover the applications which are most important at this moment and which have been mentioned above. In the InP/InGaAsP system, the substrate and the cladding layers comprise indium phosphide (InP), the active layer and the contact layer comprise indium-gallium arsenide (InGaAs) or indium-gallium arsenide-phosphide (InCaAsP), and the intermediate layer comprises indium-gallium arsenide (InGaAs) as semiconductor materials. Suitable intermediate layers have an indium content of between 20 and 45 at. %, and preferably an indium content of approximately 30 at. %. In the InGaP/InAlGaP material system, the substrate and the contact layer comprise gallium arsenide (GaAs), the cladding layers comprise indium-aluminium-gallium phosphide (InAlGaP), the active layer comprises indium-gallium phosphide (InGaP) or indium-aluminium-gallium phosphide (InAlGaP), the contact layer comprises gallium arsenide (GaAs), and the intermediate layer comprises indium-gallium phosphide (InGaP) as the semiconductor materials. Suitable intermediate layers in this system have an indium content of between 32 at. % and 45 at. %, preferably an indium content of approximately 35 at. %. As noted above, excellent results are also obtained in each of the semiconductor material systems when the active layer emits radiation with a comparatively short wavelength. In the InGaP/InGaAlP material system, for example, a wavelength of 633 nm is the shortest wavelength at which practical diode lasers emit at this moment. This emission wavelength may be realized in various ways: by the addition of aluminium to the active layer, by constructing the active layer in the form of a (multi)quantum well, and by rendering the material of the active layer disorderly, or by a combination of these measures. It is further noted that the portions of the intermediate layer situated outside the mesa may be removed in all modifications of ridge-type lasers, as already described for the first modification above. The advantages of the intermediate layer according to the invention remain in that case. The lower starting current is in fact mainly achieved owing to the portion of the intermediate layer situated above the active region of the diode laser.

BRIEF DESCRIPTION OF THE DRAWING

The invention will now be explained in more detail with reference to three embodiments and the accompanying drawing, in which.

Figure 1:
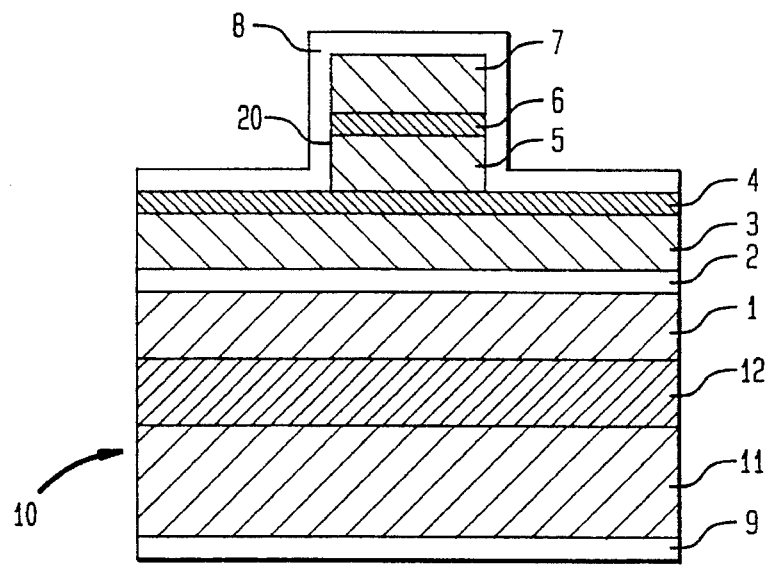
FIG. 1 is a cross-section of a first embodiment of an optoelectronic semiconductor device according to the invention comprising a semiconductor diode laser.

The Figures are diagrammatic and not drawn to scale, the dimensions in the thickness direction being particularly exaggerated for the sake of clarity. Corresponding parts are generally given the same reference numerals in the various embodiments. Semiconductor regions of the same conductivity type are usually hatched in the same direction.

DESCRIPTION OF THE PREFERRED EMBODIMENTS

FIG. 1 shows a cross-section of a first embodiment of an optoelectronic semiconductor device according to the invention, here comprising a semiconductor diode laser with a mesa 20. The cross-section is perpendicular to the longitudinal direction of the resonance cavity of the laser. The device comprises a semiconductor body 10 with a substrate 11 which is provided with a connection conductor 9 and which is of a first, here the n-conductivity type and in the present example consists of monocrystalline gallium arsenide. A semiconductor layer structure is provided thereon comprising inter alia a buffer layer 12 of n-GaAs, a first cladding layer 1 of n-InAlGaP, an active layer 2 of InGaP, a second cladding layer 3 of p-InAlGaP, a third cladding layer 5 also of p-InAlGaP, a transition layer 6 of InGaP, and a contact layer 7 of p-GaAs. An intermediate layer 4 is present between the second cladding layer 3 and the third cladding layer 5. Owing to a comparatively small thickness of the second cladding layer 3, here approximately 0,2 μm, the intermediate layer 4 lies within the amplification profile of the active layer 2. According to the invention, the intermediate layer 4 comprises a semiconductor material, here InGaP, whose lattice constant differs from the lattice constant of the substrate, in this case because the InGaP comprises approximately 40 at. % indium, to such an extent that the semiconductor material of the intermediate layer 4 has a greater bandgap than the energy of the radiation emitted by the active layer 2. As a result, the absorption of this radiation in the intermediate layer 4 is reduced, so that the diode laser has a particularly low starting current. The intermediate layer 4 according to the invention also has a very good etching stopper effect. This is caused on the one hand by the fact that the intermediate layer 4 comprises only InGaP, and accordingly is chemically comparatively strongly different from the third cladding layer 5, which comprises InAlGaP here, and on the other hand by the fact that a comparatively thick intermediate layer 4, in this example approximately 6 nm thick, could be used thanks to the reduced absorption of the intermediate layer 4. The intermediate layer 4 is used as an etching stopper layer in the formation of the mesa 20 here. The diode laser formed comprises the third cladding layer 5 in the mesa 20 and in addition, in this embodiment, a transition layer 6 of InGaP (without strain) and a contact layer 7, here of p-GaAs. The upper connection conductor 8 extends over the mesa 20 and over the adjacent portion of the semiconductor body 10, here a portion of the intermediate layer 4. Such a diode laser is of the index-guided type with an active region in the portion of the active layer 2 situated below the mesa 20. When current is supplied through the connection conductors 8, 9, the current is chiefly limited to the mesa 20 because the connection conductor 8 forms a substantially ohmic contact with the contact layer 7 at this area. Outside this area, a junction forming a Schottky barrier with lightly current-blocking properties is formed between the connection conductor 8 and the semiconductor body 10. The following compositions, doping levels, and thicknesses were used for the various semiconductor layers in this embodiment.

| Layer | Semiconductor | Type | Doping conc. (at/cm$^3$) | Thickness (μm) | Bandgap (eV) |
|---|---|---|---|---|---|
| 11 | GaAs (substrate) | N | $2 \times 10^{18}$ | 350 | 1,4 |
| 12 | GaAs | N | $2 \times 10^{18}$ | 0,1 | 1,4 |
| 1 | In$_{0,50}$Al$_{0,35}$Ga$_{0,15}$P | N | $5 \times 10^{17}$ | 0,8 | 2,2 |
| 2 | In$_{0,49}$Ga$_{0,51}$P | — | — | 0,1 | 1,9 |
| 3 | In$_{0,50}$Al$_{0,35}$Ga$_{0,15}$P | P | $3 \times 10^{17}$ | 0,2 | 2,2 |
| 4 | In$_{0,40}$Ga$_{0,60}$P | P | $1 \times 10^{18}$ | 0,006 | 2,1 |
| 5 | In$_{0,50}$Al$_{0,35}$Ga$_{0,15}$P | P | $3 \times 10^{17}$ | 0,8 | 2,2 |
| 6 | In$_{0,49}$Ga$_{0,51}$P | P | $1 \times 10^{18}$ | 0,01 | 1,9 |
| 7 | GaAs | P | $2 \times 10^{18}$ | 0,5 | 1,4 |

The width of the mesa 20 is 6 μm. The conductive layer 9 on the substrate 11 in this embodiment is a gold-germanium-nickel layer with a thickness of approximately 0,1 μm. The conductive layer 8 in this example comprises a platinum, a tantalum, and a gold layer with thicknesses of approximately 0,1, approximatey 0,05, and approximately 0,25 μm, respectively. The described radiation-emitting semiconductor diode is manufactured in usual manner. For the manufacture and further information, reference is merely made to the European Patent Applications no. 90200679.0 published 3 Oct. 1990 under no. 0 390 262, no. 91201195.4 published 27 Nov. 1991 under no. 0 458 409, and no. 91201194.7 published 27 Nov. 1991 under no. 0 458 408.

Figure 2:
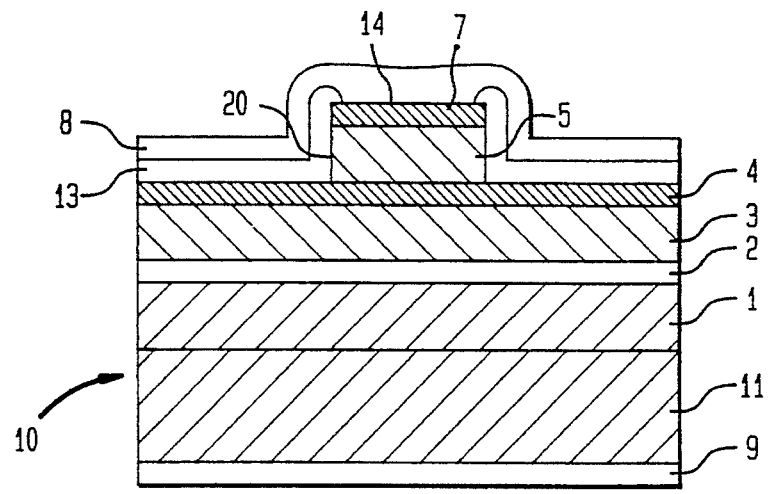
FIG. 2 is a cross-section of a second embodiment of an optoelectronic semiconductor device according to the invention comprising a semiconductor diode laser.

FIG. 2 shows a cross-section of a second embodiment of an optoelectronic semiconductor device according to the invention, here a semiconductor diode laser comprising a mesa 20. The cross-section is perpendicular to the longitudinal direction of the laser resonance cavity. The device comprises a semiconductor body 10 with a substrate 11 which is provided with a first connection conductor 9 and is of a first, here the n-conductivity type, in this example consisting of monocrystalline indium phosphide. A semiconductor layer structure is provided thereon comprising inter alia a first cladding layer 1 of n-InP, an active layer 2 of InGaAs, a second cladding layer 3 of p-InP, a third cladding layer 5 also of p-InP, and a contact layer 7 of p-InGaAs. An intermediate layer 4 is present between the second cladding layer 3 and the third cladding layer 5. Owing to a comparatively small thickness of the second cladding layer 3, here approximately 0,2 μm, the intermediate layer 4 lies within the amplification profile of the active layer 2. The semiconductor material of the intermediate layer 4 is InGaAs here. According to the invention, the intermediate layer 4 comprises a semiconductor material, here InGaAs, whose lattice constant is different from the lattice constant of the substrate, in this case because the InGaAs comprises approximately 40 at. % indium, to such an extent that the semiconductor material of the intermediate layer 4 has a greater bandgap than the energy of the radiation emitted by the active layer 2. The absorption of the active layer 4 is reduced by this, so that the diode laser has a particularly low starting current. The intermediate layer 4 according to the invention also has a very good etching stopper effect. This is caused on the one hand by the fact that the intermediate layer 4 comprises only InGaAs and accordingly deviates comparatively strongly chemically from the cladding layers which comprise InP here, and on the other hand by the fact that a comparatively thick intermediate layer 4, in this example approximately 6 nm thick, could be used thanks to the reduced absorption of the intermediate layer 4. In this embodiment of the device, also, the intermediate layer 4 is used for forming the mesa 20. The formed diode laser comprises the third cladding layer 5 and the p-InGaAs contact layer in the mesa 20. Over and adjacent the mesa 20, there is an insulating layer, here of silicon dioxide and approximately 0,2 µm thick, in which a window 14 is formed at the area of the upper side of the mesa 20. A second, in this case upper connection conductor 8 extends over the insulating layer 13 and forms a substantially ohmic contact with the contact layer 7 in the window 14. Such a diode laser is of the index-guided type with an active region in the portion of the active layer 2 situated below the mesa 20. When current is supplied through connection conductors 8, 9, the current is limited chiefly to the mesa 20 because this is where the connection conductor 8 has its only contact with the semiconductor body 10. The following compositions, doping levels and thicknesses were used for the various semiconductor layers in this embodiment.

| Layer | Semiconductor | Type | Doping conc. (at/cm$^3$) | Thickness (µm) | Bandgap (eV) |
|---|---|---|---|---|---|
| 11 | InP (substrate) | N | $2 \times 10^{18}$ | 300 | 1,4 |
| 1 | InP | N | $1 \times 10^{18}$ | 2,0 | 1,4 |
| 2 | In$_{0,53}$Ga$_{0,47}$As | — | — | 0,1 | 0,75 |
| 3 | InP | P | $1 \times 10^{18}$ | 0,2 | 1,4 |
| 4 | In$_{0,40}$Ga$_{0,60}$As | — | — | 0,006 | 0,92 |
| 5 | InP | P | $1 \times 10^{18}$ | 0,8 | 2,3 |
| 7 | In$_{0,53}$Ga$_{0,47}$As | P | $1 \times 10^{19}$ | 0,5 | 0,75 |

The width of the mesa 20 is approximately 2 µm here. The conductive layer 9 on the substrate 11 in this embodiment is a gold-germanium-nickel layer with a thickness of approximately 0,1 µm. The conductive layer 8 in this embodiment comprises a platinum layer with a thickness of approximately 0,1 µm. The described radiation-emitting semiconductor diode is manufactured in a usual manner. For the manufacture, reference is made to the same documents as referred to in the preceding embodiment. Special features are that, before the connection conductor 8 is provided, an insulating layer, for example of silicon dioxide, is provided over the semiconductor body 10, in which layer a window 14 is formed at the area of the mesa 20. When the mesa 20 is formed, a (selective) etchant for the InGaAs contact layer 7 which is used is, for example, H$_2$SO$_4$+H$_2$O+H$_2$O$_2$ (5:1:1), and a selective etchant for the third cladding layer 5 of InP is, for example, HCl+H$_3$PO$_4$ (1:1).

Figure 3:
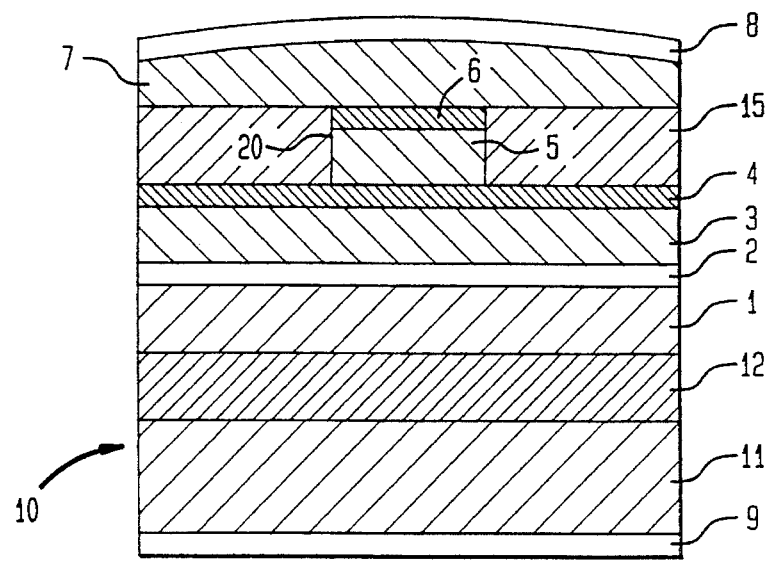
FIG. 3 is a cross-section of a third embodiment of an optoelectronic semiconductor device according to the invention comprising a semiconductor diode laser.

FIG. 3 is a cross-section of a third embodiment of an optoelectronic semiconductor device according to the invention, here again a semiconductor diode laser comprising a mesa 20. The substrate 11 and the layers 1, 2, 3, 4, 5, 6, 8, 9 and 12 correspond to the layers described with reference to the first embodiment and having corresponding reference numerals. In this embodiment, there is a further semiconductor layer 15 acting as a current-blocking layer on either side of the mesa 20. This layer 15 comprises GaAs and has a thickness which corresponds approximately to the height of the mesa, i.e. to the thickness of the third cladding layer 5. A contact layer 7 of the second conductivity type, here also of GaAs, extends over this, making contact with the transition layer 6 at the upper side of the mesa. The operation of the intermediate layer 4 in this device according to the invention is the same as described above for the first embodiment. The absorption of radiation emitted by the active layer 2 which takes place on either side of the mesa 20 in the further semiconductor layer 15 contributes to the so-called lateral mode stabilization. The starting current is slightly increased by this. Nevertheless, the starting current is comparatively low, also in this embodiment of the device, thanks to the reduced absorption power of the intermediate layer 4 at the area of the mesa 20 according to the invention. Reference is made to the first embodiment for the manufacture of this embodiment of the device. Whereas the first embodiment of the device was manufactured with one epitaxy process, the present embodiment of the device uses three epitaxy processes. In a first epitaxy process the layers 12 and 1 to 6 are provided. Then the mesa 20 is formed by means of a strip-shaped silicon dioxide mask (not shown in the drawing). Subsequently, in a second epitaxy process, the further semiconductor layer 15 is (locally) provided, which results in a substantially planar structure. Finally, after the mask has been removed, the contact layer 7 is provided over the structure in a third epitaxy process. The same doping levels and thicknesses are used for the various semiconductor layers in this embodiment as in the first embodiment, see the Table accompanying the first embodiment. The (additional) semiconductor layer 15 here comprises GaAs, is of the n-conductivity type, has a doping concentration of $5 \times 10^{17}$ at/cm$^3$, a thickness of 0,8 µm, and a bandgap of 1,4 eV.

The invention is not limited to the embodiments given, since many modifications and variations are possible to those skilled in the art within the scope of the invention. Thus, besides optoelectronic devices with diode lasers, devices with LEDs or waveguides may alternatively be used. In the latter case, the expression "energy of the radiation emitted by the active layer" should be read as "energy of the radiation present in the active layer".

Neither is the invention limited to the ridge-type lasers of the embodiments. An intermediate layer according to the invention may be advantageously used also in other structures in which a thin intermediate layer is present near the active layer with a bandgap lower than that of the cladding layers.

Finally, it should be noted that, although the semiconductor layers used in the embodiments are provided by the MOVPE method (=Metal Organic Vapour Phase Epitaxy), other techniques can also be used. Thus, besides MOVPE, MOMBE (=Metal Organic Molecular Beam Epitaxy), MBE (=Molecular Beam Epitaxy), VPE (=Vapour Phase Epitaxy) or LPE (=Liquid Phase Epitaxy) may be used.

I claim:

1. An optoelectronic semiconductor device comprising a semiconductor body (10) with a semiconductor substrate (11) of a first conductivity type on which are at least present in that order a first cladding layer (1) of the first conductivity type, an active layer (2), a second cladding layer (3) of a second conductivity type, an intermediate layer (4), and a third cladding layer (5) also of the second conductivity type, the thickness of the second cladding layer (3) being such that the distance between the active layer (2) and the intermediate layer (4) is such that during operation a part of the radiation generated in the active layer (2) reaches the intermediate layer (4), the intermediate layer (4) comprising a semiconductor material having a lower bandgap than that of the second (3) and third (5) cladding layers, characterized in that the semiconductor material of the intermediate layer (4) has a lattice constant which is different from the lattice constant of the substrate (11) and has a bandgap which is greater than the energy of the radiation emitted by the active layer (2).

2. An optoelectronic semiconductor device as claimed in claim 1, in which the intermediate layer (4) comprises a ternary semiconductor material, characterized in that the composition of the semiconductor material of the intermediate layer (4) is so chosen that the semiconductor material of the intermediate layer (4) has a smaller lattice constant than the substrate (11).

3. An optoelectronic semiconductor device as claimed in claim 1, characterized in that the value of the deviation of the lattice constant of the intermediate layer (4) as compared with the substrate lies between −0,2% and −2%.

4. An optoelectronic semiconductor device as claimed in claim 1, characterized in that the intermediate layer (4) acts as an etching stopper layer and the thickness of the intermediate layer (4) lies between 5 and 15 nm.

5. An optoelectronic semiconductor device as claimed in claim 1, which device comprises a semiconductor diode laser with two connection conductors (8, 9), characterized in that the semiconductor diode laser has a mesa (20) which comprises the third cladding layer (5), a contact layer (7) of the second conductivity type is present at least at the area of the mesa and in contact with the third cladding layer (7), and the upper connection conductor (8) extends over the contact layer (7) and the portion of the semiconductor body (10) situated adjacent the mesa (20).

6. An optoelectronic semiconductor device as claimed in claim 5, characterized in that an insulating layer (13) is provided on either side of the mesa (20), the upper connection conductor (8) extending over said insulating layers (13).

7. An optoelectronic semiconductor device as claimed in claim 5, characterized in that a further semiconductor layer (15) of the first conductivity type is present on both sides of the mesa (20), and the contact layer (7) extends over the further semiconductor layer (15).

8. An optoelectronic semiconductor device as claimed in claim 6, characterized in that the substrate 11) and the contact layer (7) comprise gallium arsenide (GaAs), the cladding layers (1, 3, 5) comprise indium-aluminium-gallium phosphide (InAlGaP), the active layer (2) comprises one of indium-gallium phosphide (InGaP) and indium-aluminium-gallium phosphide (InAlGaP), the top layer (60) comprises one of indium-gallium phosphide (InGaP) and gallium arsenide (GaAs), and the intermediate layer (4) comprises indium-gallium phosphide (InGaP) as the semiconductor materials, and the indium content of the intermediate layer (4) lies between 30 and 45 at. %.

9. An optoelectronic semiconductor device as claimed in claim 6, characterized in that the substrate (11) and the cladding layers (1, 3, 5) comprise indium phosphide (InP), the active layer (2) and the contact layer (7) comprise one of indium-gallium arsenide (InGaAs) and indium-gallium arsenide-phosphide (InGaAsP), and the intermediate layer (4) comprises indium-gallium arsenide (InGaAs) as the semiconductor materials, and the indium content of the intermediate layer (4) lies between 20 and 48 at. %.

* * * * *